United States Patent
Park et al.

(10) Patent No.: US 7,768,298 B2
(45) Date of Patent: *Aug. 3, 2010

(54) REFERENCE VOLTAGE GENERATORS FOR REDUCING AND/OR ELIMINATING TERMINATION MISMATCH

(75) Inventors: Kwang-Il Park, Yongin-si (KR); Seung-Jun Bae, Daejeon (KR); Seong-Jin Jang, Sungnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 35 days.

This patent is subject to a terminal disclaimer.

(21) Appl. No.: 12/219,213

(22) Filed: Jul. 17, 2008

(65) Prior Publication Data

US 2008/0278193 A1    Nov. 13, 2008

Related U.S. Application Data

(63) Continuation of application No. 11/790,014, filed on Apr. 23, 2007, now Pat. No. 7,403,040.

(30) Foreign Application Priority Data

May 10, 2006    (KR) .......................... 2006-0041798

(51) Int. Cl.
*H03K 17/16* (2006.01)
*H03K 19/003* (2006.01)
(52) U.S. Cl. ............................ 326/33; 326/30; 326/34
(58) Field of Classification Search .................. 326/30, 326/32–33, 86
See application file for complete search history.

(56) References Cited

U.S. PATENT DOCUMENTS

| | | | |
|---|---|---|---|
| 5,550,496 A | 8/1996 | Desroches | |
| 6,707,724 B2 | 3/2004 | Kim et al. | |
| 7,034,567 B2 | 4/2006 | Jang | |
| 7,208,972 B2 | 4/2007 | Dreps et al. | |
| 7,403,040 B2 * | 7/2008 | Park et al. | 326/86 |
| 2005/0275425 A1 | 12/2005 | Lee | |
| 2006/0181303 A1 | 8/2006 | Dreps et al. | |

FOREIGN PATENT DOCUMENTS

KR    10-2002-0066019    8/2002

* cited by examiner

*Primary Examiner*—Anh Q Tran
(74) *Attorney, Agent, or Firm*—Lee & Morse, P.C.

(57) ABSTRACT

A system including a plurality of transmission lines, a transmitter outputting respective signals to each of the plurality of transmission lines, a receiver receiving each of the plurality of signals via respective transmission lines, the receiver including a connection path connected to a termination voltage, a plurality of termination circuits distributed along the connection path, each termination circuit receiving a unique termination voltage from the connection path, receiving a respective signal and outputting a terminated input signal, a reference voltage generator including multiple reference voltage generator units connected to a common voltage, each reference voltage generator unit uniquely receiving at least one unique termination voltage and outputting a reference voltage, and a plurality of data input buffers receiving respective signals and an appropriate reference voltage of the multiple reference voltages output from the reference voltage generator.

20 Claims, 10 Drawing Sheets

REFERENCE VOLTAGE GENERATORS FOR REDUCING AND/OR ELIMINATING TERMINATION MISMATCH

CROSS REFERENCE TO RELATED APPLICATION

This is a continuation application based on application Ser. No. 11/790,014, filed Apr. 23, 2007 now U.S. Pat. No. 7,403,040, the entire contents of which is hereby incorporated by reference.

BACKGROUND OF THE INVENTION

1. Field of the Invention

The invention relates to reference voltage generators and methods for generating reference voltages. More particularly, one or more aspects of the invention relate to reference voltage generators, semiconductor systems employing such reference voltage generators and method for generating reference voltages that are configured to reduce and/or eliminate for termination mismatches.

2. Description of the Related Art

When transmitting signals between semiconductor devices, impedance matching may be performed to reduce signal reflection. Signal reflection, i.e., signal degradation, may occur if the impedance of a transmission line does not match that of a load being driven.

Signal reflections may cause distortion in the form of, e.g., ringing and/or stair-stepping, which may, in turn, lead to, e.g., false triggering in clock lines, erroneous bits in data, address and control lines, increased clock and signal jitter, etc.

Termination circuits such as termination resistors may be used to improve signal integrity, e.g., reduce signal reflection. Termination resistors may be provided internally and/or externally to a semiconductor device. Internally provided termination resistors may be referred to as on-chip termination resistors or on-die termination resistors.

Conventional termination circuits may include a receiver including a conventional reference voltage generator that provides a reference voltage based on a ground voltage and a power supply voltage of the receiver. In such devices, any variation in a ground voltage and/or a power supply voltage of a transmitter is not factored into the determination of the reference voltage. Thus, a data error rate of a logic level determination of data input signal may increase, and performance of the transmitter and receiver interface may be degraded. Termination circuits employing and/or generating more accurate reference voltage values are desired.

SUMMARY OF THE INVENTION

One or more aspects of the invention is therefore directed to reference voltage generators and methods for generating reference voltages, which may be employable by semiconductor systems and which substantially overcome one or more of the problems due to the limitations and disadvantages of the related art.

It is therefore a feature of an embodiment of the present invention to provide reference voltage generators capable of generating more accurate reference voltages based on at least one voltage signal from each of a transmitter unit and a receiver unit.

It is therefore a separate feature of embodiments of the present invention to provide a semiconductor device system employing a reference voltage generator capable of reducing and/or eliminating signal mismatch by providing more accurate reference voltages relative to conventional systems.

At least one of the above and other features and advantages of the present invention may be realized by providing a system including a plurality of transmission lines, a transmitter outputting respective signals to each of the plurality of transmission lines, a receiver receiving each of the plurality of signals via respective transmission lines, the receiver including a connection path connected to a termination voltage, a plurality of termination circuits distributed along the connection path, each termination circuit receiving a unique termination voltage from the connection path, receiving a respective signal and outputting a terminated input signal, a reference voltage generator including multiple reference voltage generator units connected to a common voltage, each reference voltage generator unit uniquely receiving at least one unique termination voltage and outputting a reference voltage, and a plurality of data input buffers receiving respective signals and an appropriate reference voltage of the multiple reference voltages output from the reference voltage generator.

The common voltage may be a first voltage signal based on a transmitter voltage. The system may include a first voltage transmission line, and the transmitter may include a first voltage driver outputting the first voltage signal to the first voltage transmission line. The first voltage signal may be supplied to each reference voltage generator through a common resistor. The multiple reference voltage generator units may be a plurality of reference voltage generator units and each reference voltage generator unit may receive a corresponding unique termination voltage.

Each reference voltage generator unit may include a first resistor between a reference node and the unique termination voltage, and a second resistor between the common voltage and the reference node. The second resistor may be common to all reference voltage generator units. The second resistor may be separate for each reference voltage generator unit. The common voltage may be a first voltage signal based on a transmitter voltage. The common voltage may include a first voltage signal and a second voltage signal. The first voltage signal may be based on a driver ground voltage of the transmitter and the second voltage signal is based on a driver power supply voltage of the transmitter.

The system may include a first voltage transmission line and a second voltage transmission line, and wherein the transmitter may include a first voltage driver outputting the first voltage signal to the first voltage transmission line and a second voltage driver outputting the second voltage signal to the second voltage transmission line. Each reference voltage generator unit may generate a reference voltage based on an average of a low signal and a high signal.

The low signal may be an average of the first voltage signal and a first termination voltage and the high signal is an average of the second voltage signal and a second termination voltage. The first and second termination voltages may be equal. The first and second termination voltages may be from adjacent termination circuits.

At least one of the above and other features and advantages of the present invention may be separately realized by providing a method of generating multiple reference voltages in a system having a plurality of transmission lines, a transmitter outputting respective signals to each of the plurality of transmission lines, and a receiver receiving each of the plurality of signals via respective transmission lines, the method including distributing a termination voltage along a connection path, generating a plurality of terminated input signals based on each of the plurality of signals and a corresponding unique termination voltage received from the connection path, and generating multiple reference voltages from unique termination voltages and a common voltage, and outputting a reference voltage for each of the plurality of terminated input signals.

Generating multiple reference voltages from the unique termination voltages and the common voltage may include using a plurality of resistors arranged between the each of the termination voltages received from the connection path and the common voltage. The method may include receiving the common voltage from the transmitter, wherein the common voltage may correspond to a voltage of the transmitter.

At least one of the above and other features and advantages of the present invention may be separately realized by providing a machine-readable medium that provides executable instructions, which, when executed by a processor, cause the processor to perform a method of generating multiple reference voltages in a system having a plurality of transmission lines, a transmitter outputting respective signals to each of the plurality of transmission lines, and a receiver receiving each of the plurality of signals via respective transmission lines, the method including distributing a termination voltage along a connection path, generating a plurality of terminated input signals based on each of the plurality of signals and a corresponding termination voltage received from the connection path, and generating multiple reference voltages from unique termination voltages and a common voltage, and outputting a reference voltage for each of the plurality of terminated input signals.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
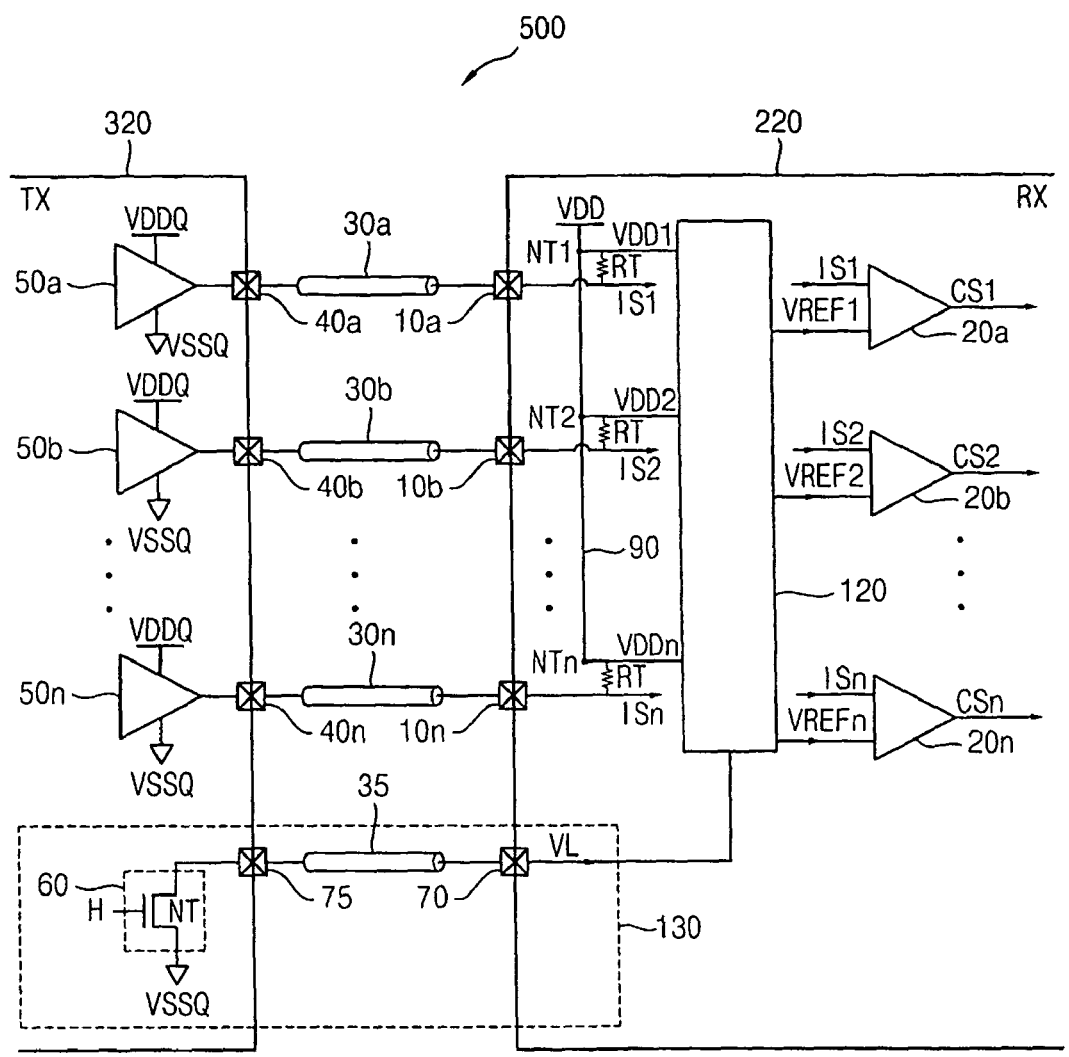
FIG. 1 illustrates a first exemplary embodiment of a semiconductor device system employing one or more aspects of the invention.

Korean Patent Application No. 2006-0041798, filed on May 10, 2006, in the Korean Intellectual Property Office, is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the specification.

In the following description, it will be understood that when elements are described as being connected to each other, they may be directly connected or one or they may be connected via one or more intervening elements. If elements are described as being directly connected, then the elements are directly connected to each other and there are no intervening elements therebetween.

FIG. 1 illustrates a first exemplary embodiment of a semiconductor device system 500 employing one or more aspects of the invention. The semiconductor device 500 may include a receiver 220, a transmitter 320, a first voltage signal generator 130, and a plurality of transmission lines 30*a* to 30*n* connected between the transmitter 320 and the receiver 220.

The first voltage signal generator 130 may include a first voltage transmission line 35 connected between the transmitter 320 and the receiver 220. The first voltage transmission line 35 may be connected to a first voltage driver pin 75 of the transmitter 320 and a first voltage input pin 70 of the receiver 220.

The transmitter 320 may include a plurality of data output drivers 50*a* to 50*n*, a plurality of data output pins 40*a* to 40*n*, and a first voltage driver 60. The first voltage driver 60 may include a n-type transistor NT, e.g., an NMOS transistor, having a first terminal connected to the first voltage driver pin 75 and a second terminal connected to a driver ground voltage VSSQ. Each of the data output pins 40*a* to 40*n* of the transmitter 320 may be connected to a respective one of the data output drivers 50*a* to 50*n*. Each of the data output drivers 50*a* to 50*n* may be connected to a driver power supply voltage VDDQ and the driver ground voltage VSSQ. Each of the data output drivers 50*a* to 50*n* may supply a terminated data input signal IS1 to ISn to a respective one of the data input pins 10*a* to 10*n* of the receiver 220.

The receiver 220 may be supplied with a receiver power supply voltage VDD and may include a plurality of data input pins 10*a* to 10*n*. The receiver 220 may include a reference voltage generator 120. The reference voltage generator 120 may include a plurality of input terminals connected to the receiver power supply voltage VDD via the power supply line 90 for receiving the termination voltage VDD. As a result of characteristics, e.g., resistance, of, e.g., the power supply line 90, each of the input terminals may receive a respective termination voltage VDD1 to VDDn based on the receiver power supply voltage VDD. That is, in embodiments of the invention, each of the termination voltages VDD1 to VDDn may be different from one another.

Each of the data input pins 10*a* to 10*n* of the receiver 220 may be connected to the power supply line 90 via a respective one of a plurality of termination resistors RT. That is, e.g., each input terminal of the reference voltage generator 120 may be connected to the respective one of the data input pins 10a to 10n via the respective one of the plurality of the termination resistors RT connected therebetween. The reference voltage generator 120 may include a plurality of output terminals for outputting a respective one of the reference voltages VREF1 to VREFn.

Referring to FIG. 1, the reference voltage generator 120 may also be connected to the first voltage input pin 70, and more particularly, to the first voltage signal generator 130. Thus, in embodiments of the invention, the reference voltage generator 120 may receive a voltage signal corresponding to, e.g., the ground supply voltage VSSQ of the transmitter 320, via the first voltage signal generator 130. Accordingly, the voltage signal from the transmitter 320 may be employed by the reference voltage generator 120 to generate the respective reference voltages VREF1 to VREFn. Thus, in embodiments of the invention, more accurate reference voltages may be generated.

The receiver 220 may include a plurality of data input buffers 20a to 20n. Each of the data input buffers 20a to 20n may receive the respective one of the reference voltages VREF1 to VREFn from the reference voltage generator 120. The data input buffers 20a to 20n may also receive the respective one of the terminated data input signals IS1 to ISn, and may compare the respective one of the terminated data input signals IS1 to ISn to the received respective one of the reference voltages VREF1 to VREFn. Based on the comparison of the respective one of the terminated data input signals IS1 to ISn to the respective one of the reference voltages VREF1 to VREFn, the respective one of the data input buffers 20a to 20n may output a respective input signal CS1 to CSn.

Figure 2:
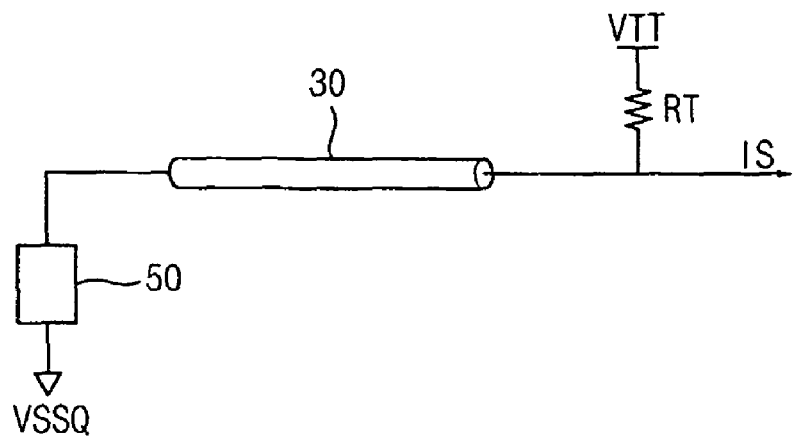
FIG. 2 illustrates an exemplary data signal transmission path employable by the semiconductor device system shown in FIG. 1.

FIG. 2 illustrates an exemplary data signal transmission path of an open-drain type data driver employable by the semiconductor device system 500 shown in FIG. 1. Referring to FIGS. 1 and 2, each of the transmission lines 30a to 30n may have one end connected to a respective one of the data output pins 40a to 40n of the transmitter 320 and another end connected to a respective one of the data input pins 10a to 10n of the receiver 220. The end of the respective transmission line 30a to 30n connected to the respective data input pin 10a to 10n may be connected to a first terminal of a respective termination resistor RT. Another terminal of the respective termination resistor may be connected to a termination voltage VTT, e.g., VDD1. In some embodiments of the invention, a low voltage VOL, a high voltage VOH and a corresponding reference voltage VREF of each of the terminated data input signals IS may be defined by the following three equations, respectively.

$$VOL = VTT \times RON/(RON+RT) \quad (1)$$

$$VOH = VTT \quad (2)$$

$$VREF = (VOL+VOH)/2 = VTT \times (RON+RT/2)/(RON+RT) \quad (3)$$

In Equation (1), VOL corresponds to a low voltage of the respective terminated data input signal IS, VTT corresponds to a termination voltage, RON corresponds to a resistance from the driver ground voltage VSSQ to the respective data input pin 10a to 10n of the receiver 220, and RT corresponds to a resistance of the respective termination resistor. In Equation (2), VOH corresponds to a high voltage of the respective terminated data input signal IS.

Figure 3:
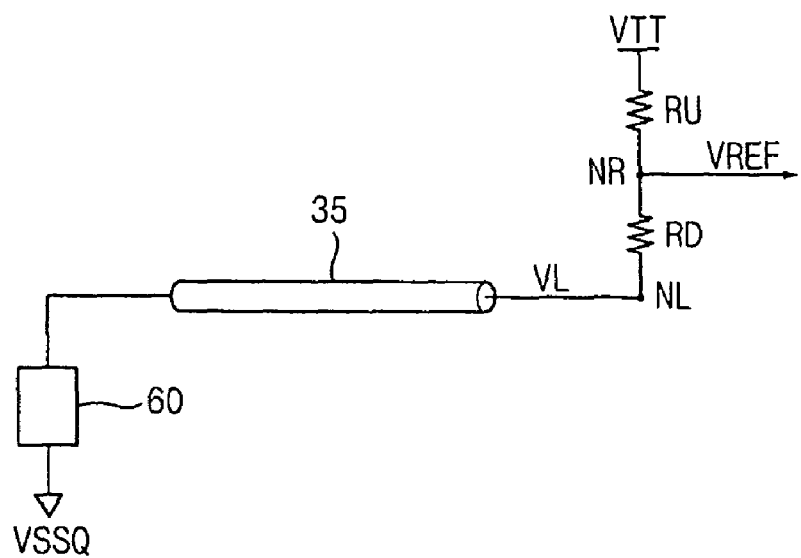
FIG. 3 illustrates an exemplary embodiment of a reference voltage transmission path employable by the semiconductor device system shown in FIG. 1.

FIG. 3 illustrates an exemplary embodiment of a reference voltage transmission path of an open-drain type voltage driver employable by the semiconductor device system 500 shown in FIG. 1. Referring to FIGS. 1 and 3, the first voltage transmission line 35 may have one end connected to the first voltage input pin 70 of the receiver 220 and another end connected to the first voltage driver pin 75 of the transmitter 320, i.e., the first voltage driver 60 of the transmitter 320. As shown in FIG. 3, the reference voltage transmission path may include a pull-up resistor RU and a pull down resistor RD. The pull-up resistor RU may be connected between the respective termination voltage VTT and a reference node NR. The pull-down resistor RD may be connected between the reference node NR and a voltage node NL connected to the first voltage input pin 70 for receiving a respective voltage signal VL. In some embodiments of the invention, a reference voltage of the reference voltage transmission path may be defined by Equation (4).

$$VREF = (VOL+VOH)/2 = VTT \times (RON+RU)/(RON+RD+RU) \quad (4)$$

In equation (4), VOL and VOH respectively correspond to low voltage and a high voltage of the voltage signal VL, RON corresponds to a resistance from the driver ground voltage VSSQ to the voltage node NL, RU corresponds to a resistance of the pull-up resistor, RD corresponds to a resistance of the pull-down resistor, and VTT corresponds to a termination voltage supplied to a respective terminal of the pull-up resistor RU.

Figure 4:
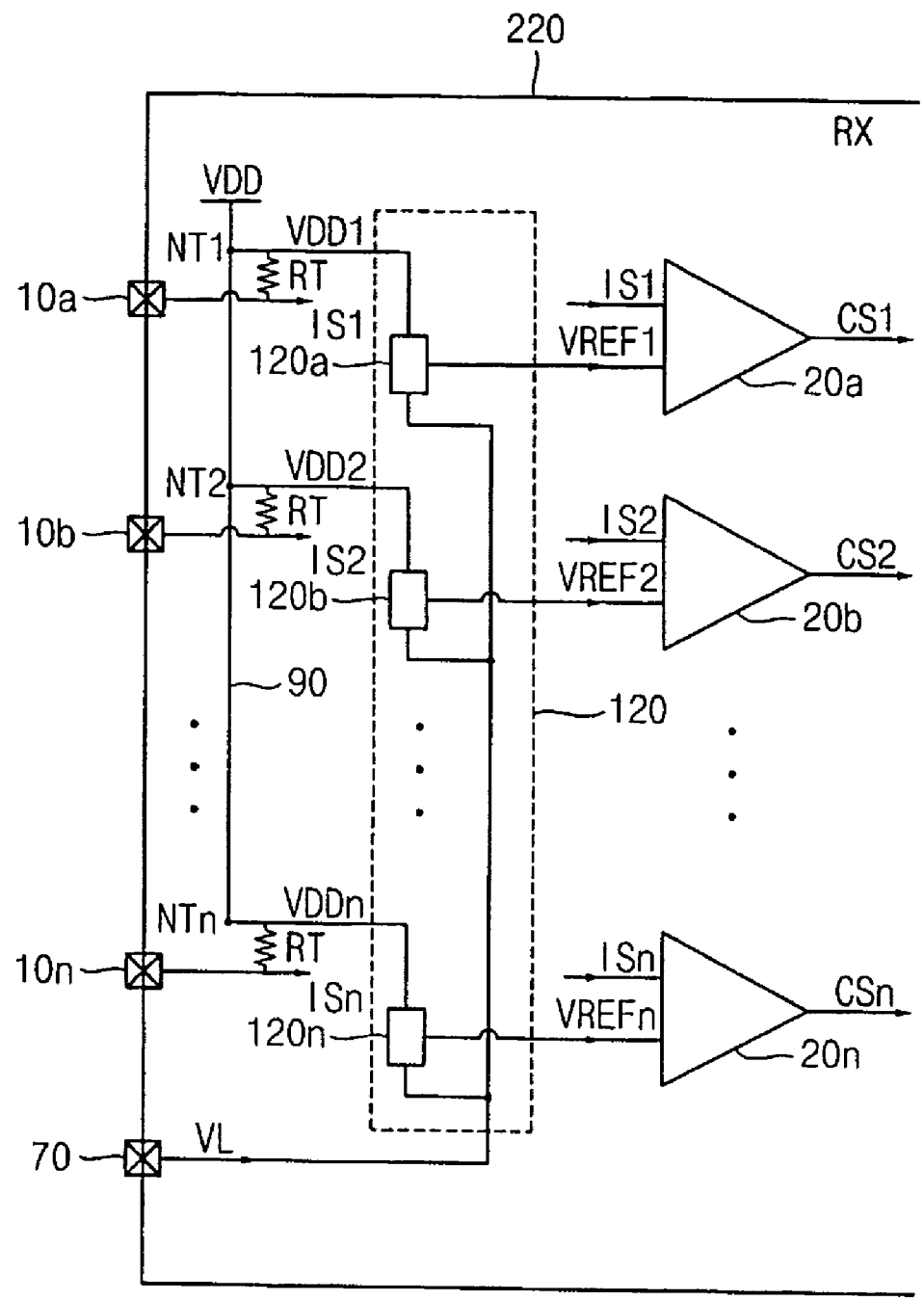
FIG. 4 illustrates an exemplary embodiment of a receiver employing one or more aspects of the invention.

FIG. 4 illustrates additional features of the exemplary embodiment of the receiver 220 shown in FIG. 1. As discussed above, the receiver 220 may include the reference voltage generator 120. In some embodiments of the invention, the reference voltage generator 120 may include a plurality of reference voltage generating units 120a to 120n.

Figure 5:
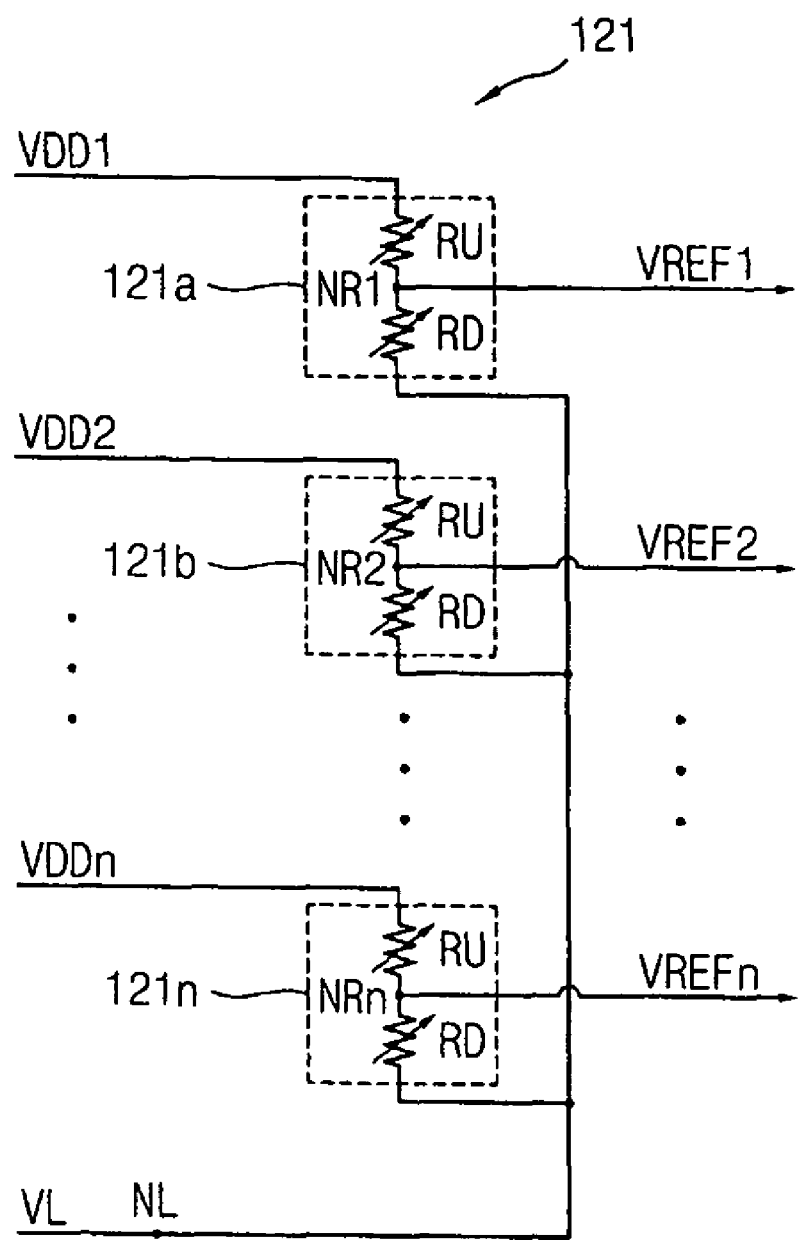
FIG. 5 illustrates a first exemplary embodiment of a reference voltage generator employable by the receiver shown in FIG. 4.

FIG. 5 illustrates a first exemplary embodiment of a reference voltage generator 121 employable as the reference voltage generator 120 of the receiver 220 shown in FIG. 4. Referring to FIG. 5, the reference voltage generator 121 may include a plurality of reference voltage generating units 121a to 121n. As shown in FIG. 5, each of the reference voltage generating units 121a to 121n may include a pull-up resistor RU and a pull-down resistor RD. For each reference voltage generating unit 121a to 121n, the pull-up resistor RU may be connected to the pull-down resistor RD at a respective reference node NR1 to NRn. As shown in FIG. 5, the respective reference voltage VREF1 to VREFn may correspond to a voltage at the respective reference node NR1 to NRn.

More particularly, e.g., each pull-up resistor RU may be connected between the respective termination voltage VDD1 to VDDn and the respective reference node NR1 to NR2, and each pull-down resistor RD may be connected between the respective reference node NR1 to NR2 and the voltage node NL. As discussed above, a voltage of the voltage node NL may correspond to the voltage signal VL from the first voltage signal generator 130. In embodiments of the invention, the pull-up resistors RU and/or the pull down resistors RD may be variable resistors having a resistance in accordance with a resistance control circuit (not shown).

More particularly, in the following description, resistors may be identified as variable and/or may be simply referred to as a resistor, however, any of the resistors may be a resistor having a predetermined value and/or a variable resistor. That is, embodiments of the invention, are not limited by the exemplary embodiments shown in the accompanying drawing figures.

As shown in FIG. 5, the reference voltage generator 120 may receive the voltage signal, e.g., VL. Therefore, the reference voltage generator 120 may generate respective reference voltages VREF1 to VREFn based on the voltage signal, e.g., VL, of the transmitter 320 as well as respective termination voltages VDD1 to VDDn of the receiver 220. Thus, embodiments of the invention may enable more accurate reference voltage(s) to be generated by the reference voltage generator 120. Therefore, embodiments of the invention may also enable a data error rate of logic level determination of input data signals to be reduced and performance of the semiconductor device system 500 to be maintained and/or improved.

Figure 6:
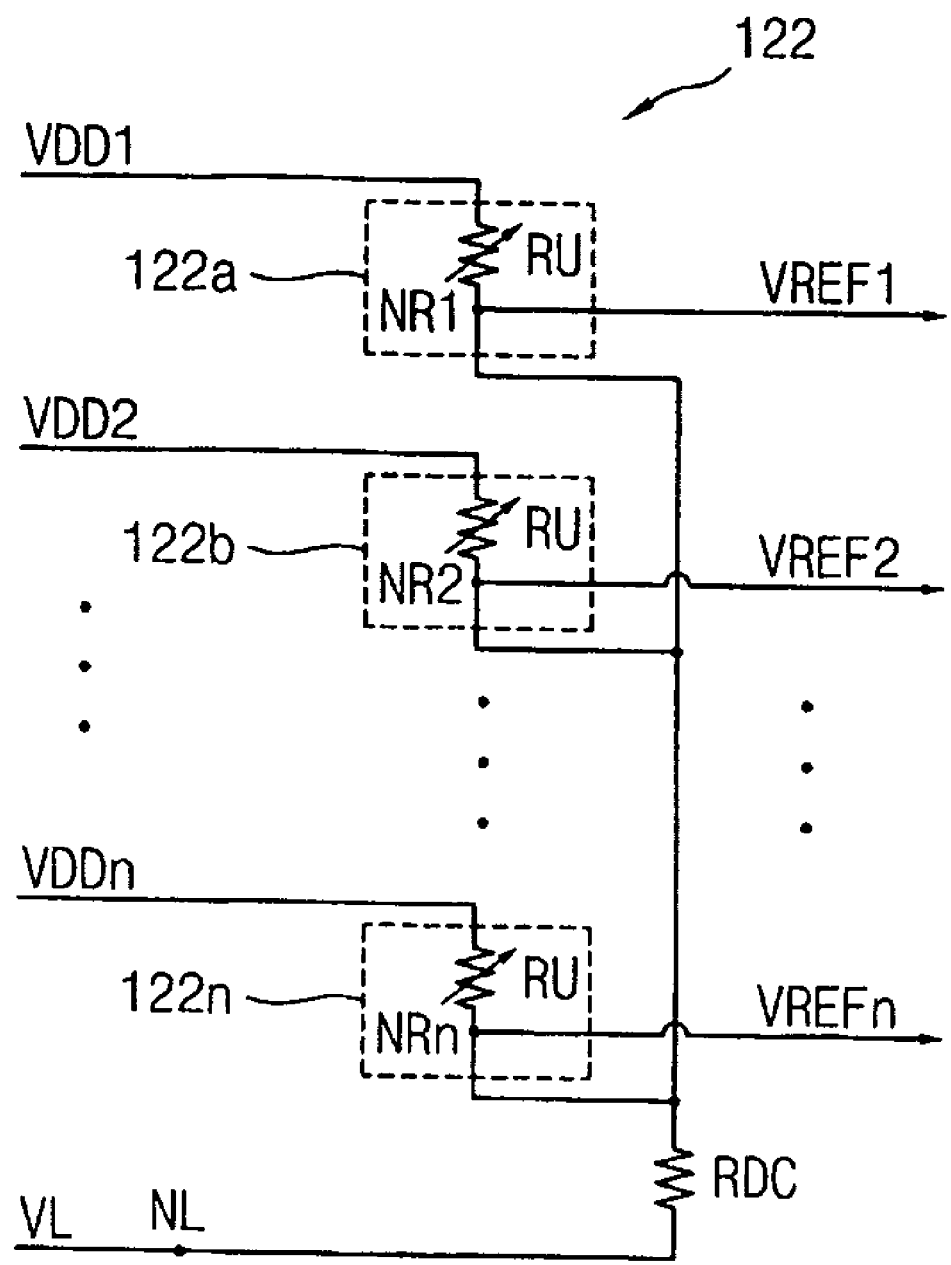
FIG. 6 illustrates a second exemplary embodiment of a reference voltage generator employable by the receiver shown in FIG. 4.

FIG. 6 illustrates a second exemplary embodiment of a reference voltage generator 122 employable as the reference voltage generator 120 of the receiver shown in FIG. 4. In general, only differences between the first exemplary reference voltage generator 121 shown in FIG. 5 and the second exemplary reference voltage generator 122 shown in FIG. 6 will be described below.

As shown in FIG. 6, in some embodiments of the invention, the reference voltage generator 122 may include a plurality of reference voltage generating units 122a to 122n. Each of the reference voltage generating units 122a may include a pull-up resistor RU connected between a respective one of the termination voltages VDD1 to VDDn and a respective one of the reference nodes NR1 to NRn. In some embodiments of the invention, as shown in FIG. 6, a common pull-down resistor RDC may be connected between all of the reference nodes NR1 and the voltage node NL.

Figure 7:
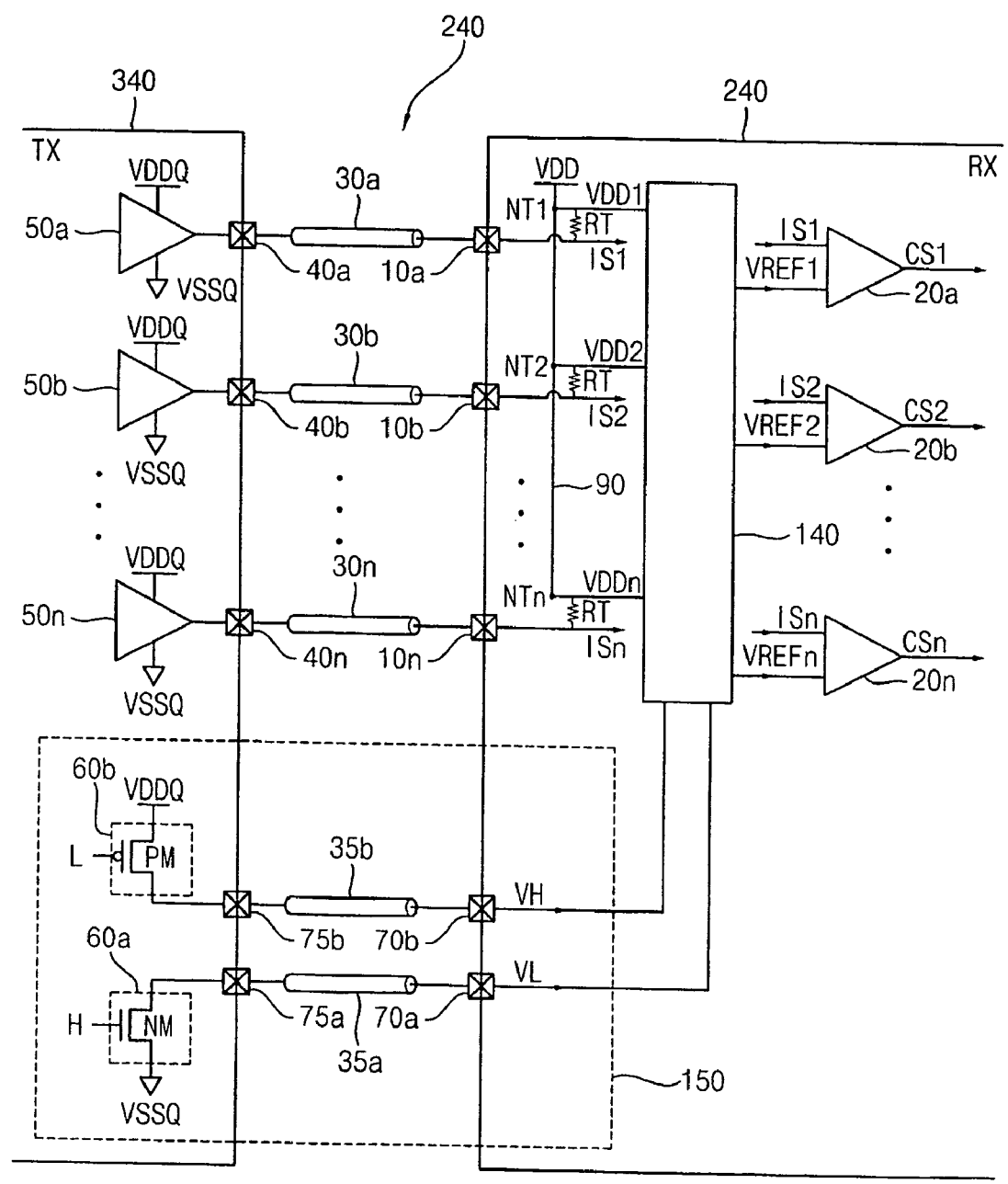
FIG. 7 illustrates a second exemplary embodiment of a semiconductor device system employing one or more aspects of the invention.

FIG. 7 illustrates a second exemplary embodiment of a semiconductor device system 600 employing one or more aspects of the invention. In general, only differences between the first exemplary semiconductor device system 500 shown in FIG. 1 and the second exemplary semiconductor device system 600 shown in FIG. 7 will be described below. In some embodiments of the invention, the semiconductor device system 600 may include a transmitter 340, a receiver 240, the plurality of transmission lines 30a to 30n, and a first and second voltage generator 150.

Similar to the transmitter 320 of the first exemplary semiconductor device system 500, the transmitter 340 of the second exemplary semiconductor device system 600 may include the plurality of data output drivers 50a to 50n and the plurality of data out put pins 40a to 40n. The transmitter 340 may also include a plurality of voltage driver pins 75a, 75b instead of the voltage driver pin 75 of the transmitter 320. Each of the data output drivers 50a to 50n may be connected to the driver power supply voltage VDDQ and the driver ground voltage VSSQ.

Similar to the receiver 220 of the first exemplary semiconductor device system 500, the receiver 240 of the second exemplary semiconductor device system 600 may include the plurality of data input pins 10a to 10n and a plurality of data input buffers 20a to 20n. The receiver 240 may also include a reference voltage generator 140 and a plurality of voltage input pins 70a, 70b, instead of the voltage generator 120 and the voltage input pin 70, respectively, of the transmitter 220.

The first and second voltage signal generator 150 may include a plurality of voltage transmission lines 35a, 35b. Each of the transmission lines 35a, 35b of the first and second voltage generator 150 may be connected between a respective one of the voltage driver pins 75a, 75b and a respective one of the voltage input pins 70a, 70b. More particularly, each voltage driver 60a, 60b of the transmitter 340 may be connected between a driver supply voltage, e.g., VDDQ, VSSQ, of the transmitter 340 and a respective one of the voltage driver pins 75a, 75b.

For example, in some embodiments of the invention, as shown in FIG. 7, one of the voltage drivers, e.g., 60b, may be connected between the driver power supply voltage VDDQ and the respective voltage driver pin 75b, and another of the voltage drivers, e.g., 60a, may be connected between the driver ground voltage VSSQ and the respective voltage driver pin 75a. The voltage transmission line 35a connected to the voltage driver 60a, which may be connected to the driver ground voltage VSSQ, may provide a first voltage signal VL to the receiver 240. The voltage transmission line 35b connected to the voltage driver 60b, which may be connected to the driver power supply voltage VDDQ, may provide a second voltage signal VH to the receiver 240. The first voltage signal VL may correspond to a low voltage signal and the second voltage signal VH may correspond to a high voltage signal of the transmitter 340.

Accordingly, as shown in FIG. 7, the second exemplary reference voltage generator 140 may receive a plurality of voltage signals, e.g., VH and VL. Therefore, the reference voltage generator 140 may generate respective reference voltages VREF1 to VREFn based on a plurality of voltage signals, e.g., VH and VL, of the transmitter 340 as well as respective termination voltages VDD1 to VDDn of the receiver 240. Thus, embodiments of the invention may enable more accurate reference voltage(s) to be generated by the reference voltage generator 240. Therefore, embodiments of the invention may also enable a data error rate of logic level determination of input data signals to be reduced and performance of the semiconductor device system 600 to be maintained and/or improved.

Figure 8:
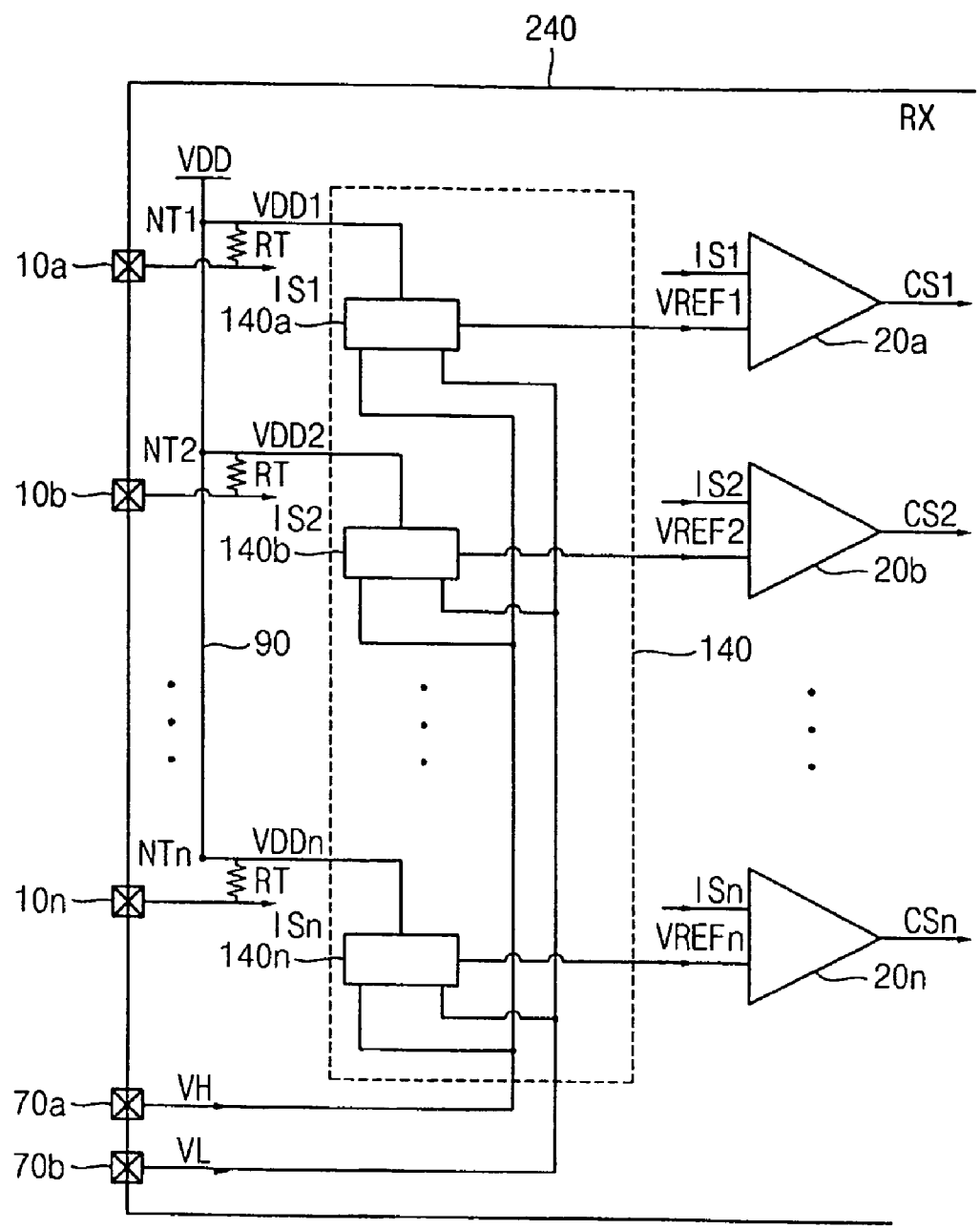
FIG. 8 illustrates a first exemplary embodiment of a receiver employable by the semiconductor device system shown in FIG. 7.

FIG. 8 illustrates additional features of the exemplary receiver 240 employable by the semiconductor device system shown in FIG. 7. More particularly, FIG. 8 illustrates additional features of the voltage generator 140 of the receiver 240. As shown in FIG. 8, the voltage generator 140 may include a plurality of reference voltage generating units 140a to 140n. Each of the reference voltage generating units 140a to 140n may receive each of the plurality of voltage signals, e.g., VH and VL, as well as the respective one of the termination voltages VDD1 to VDDn. Thus, as discussed above, in some embodiments of the invention, the reference voltage generator 140 may generate respective reference voltages VREF1 to VREFn using one or more of the voltage signals VH and VL corresponding to, e.g., drive supply and ground voltages VDDQ and VSSQ of the transmitter 340.

Figure 9:
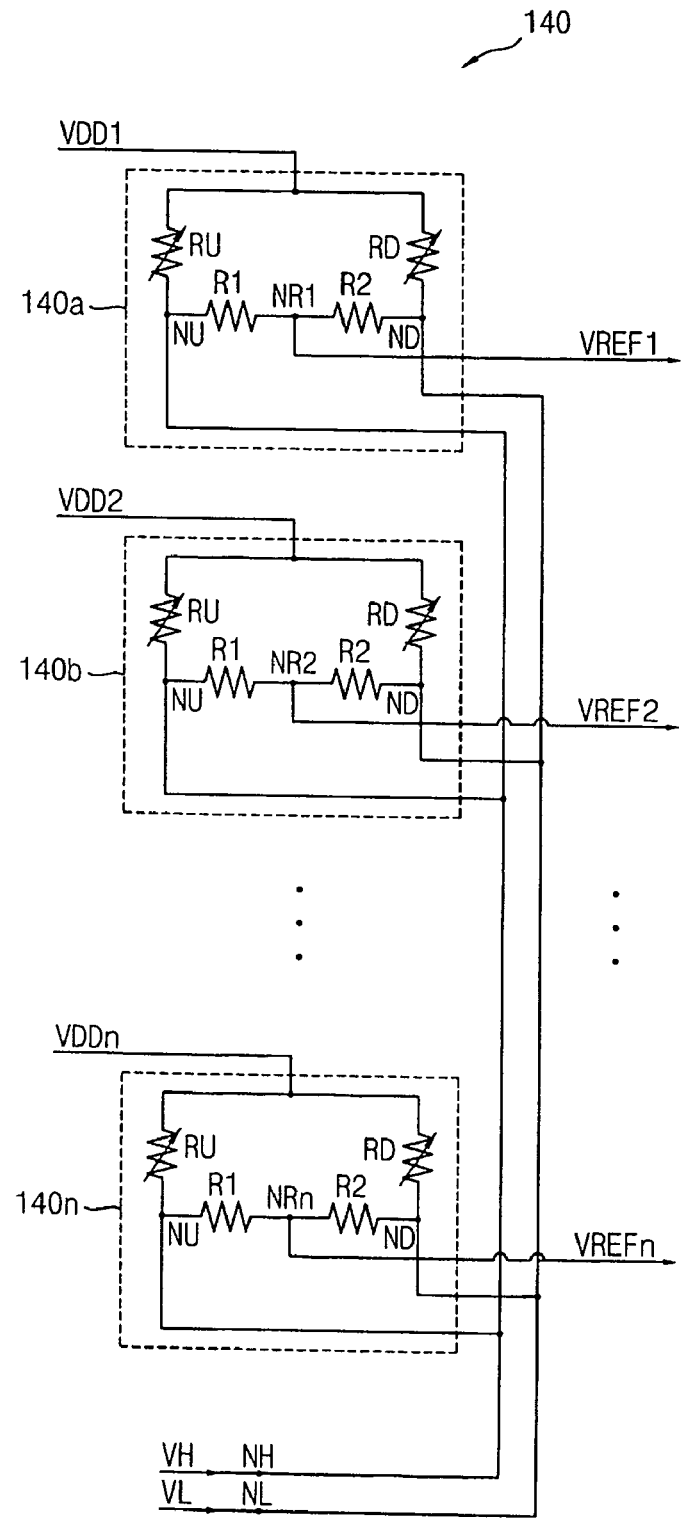
FIG. 9 illustrates an exemplary embodiment of a reference voltage generator employable by the receiver shown in FIG. 8.

FIG. 9 illustrates an exemplary embodiment of the reference voltage generator 140 employable by the receiver 240 shown in FIG. 8. As shown in FIG. 9, the reference voltage generator 140 may include n reference voltage generating units 140a to 140n. Each of the reference voltage generating units 140a to 140n may include a plurality of resistors, and more particularly, e.g., a pull-up variable resistor RU, a pull-down variable resistor RD, a first resistor R1 and a second resistor R2. Resistances of the pull-up variable resistor RU and the pull-down variable resistor RD may be set by a resistance control circuit (not shown), which may be included in the receiver 240. As discussed above, embodiments of the invention are not limited to the types of resistors, e.g., variable resistor or resistor having a predetermined resistance, shown in the accompanying Figures.

More particularly, as shown, e.g., in FIG. 9, for each voltage generating unit 140a to 140n, the pull-down resistor RD may be connected between the respective termination voltage VDD1 to VDDn and the first voltage signal VL, which may be supplied via a first voltage node NL of the reference voltage generator 140, and the pull-up resistor RU may be connected between the respective termination voltage VDD1 to VDDn and the second voltage signal VH, which may be supplied via a second voltage node NH of the reference voltage generator 140. The first voltage node NL of the reference voltage generator 140 may be connected to a respective pull-down node ND of the voltage generating unit 140a to 140n, and the second voltage node NH of the voltage generator 140 may be connected to a respective pull-up node NU of the voltage generating unit 140a to 140n. The first resistor R1 may be connected between the respective pull-up node NU and a respective reference node NR1 to NRn of the voltage generating unit 140a to 140n, and the second resistor R2 may be connected between the respective pull-down node ND and the respective reference node NR1 to NRn of the respective voltage generating unit 140a to 140n. The respective reference node NR1 to NRn may have a voltage corresponding to the respective reference voltage VREF1 to VREFn generated by the reference voltage generator 150.

Figure 10:
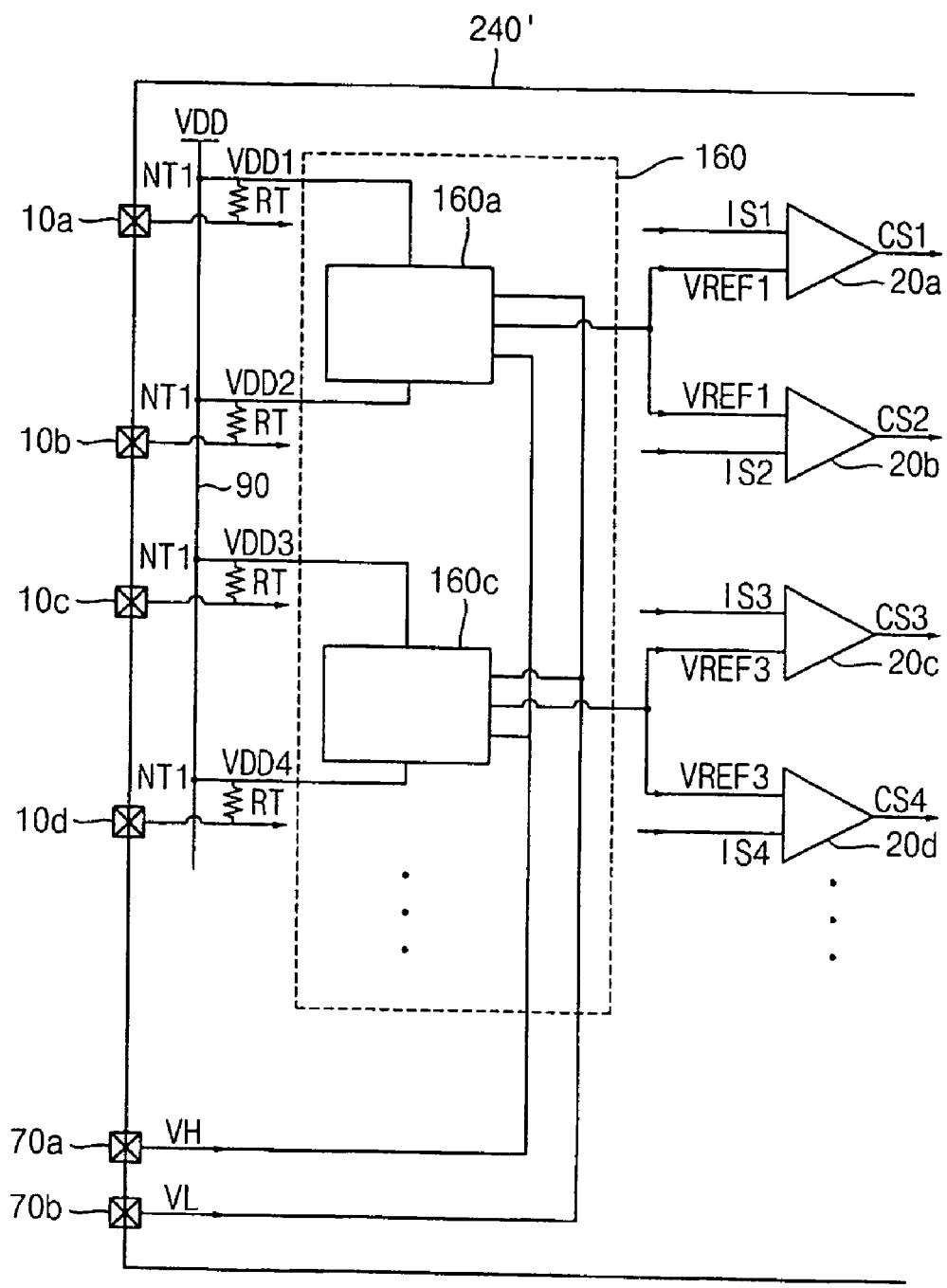
FIG. 10 illustrates a second exemplary embodiment of a receiver employable by the semiconductor device system shown in FIG. 7.

FIG. 10 illustrates a second exemplary embodiment of a receiver 240' employable by the semiconductor device system shown in FIG. 7. In general, only differences between the first exemplary receiver 240 shown in FIG. 8 and the second exemplary receiver 240' shown in FIG. 10 will be described below. As shown in FIG. 10, the second exemplary receiver 240' may include a reference voltage generator 160 instead of the reference voltage generator 140. As shown in FIG. 10, the reference voltage generator 160 may include a fewer number of reference voltage generating units 160a to 160c than a number of terminated data input signals IS1 to ISn. That is, e.g., the reference voltage generator 160, for receiving four terminated data input signals IS1 to IS4, may include two, i.e., less than four, voltage generating units 160a and 160c. More particularly, in some embodiments of the invention, each voltage generating unit 160a, 160c may be shared by a plurality, e.g., two, of the terminated data input signals IS1 to ISn.

Accordingly, as shown in FIG. 10, each generated reference voltage, e.g., VREF1, VREF3, may be supplied to a plurality of the data input buffers, e.g., 20a, 20b, 20c, 20d.

Figure 11:
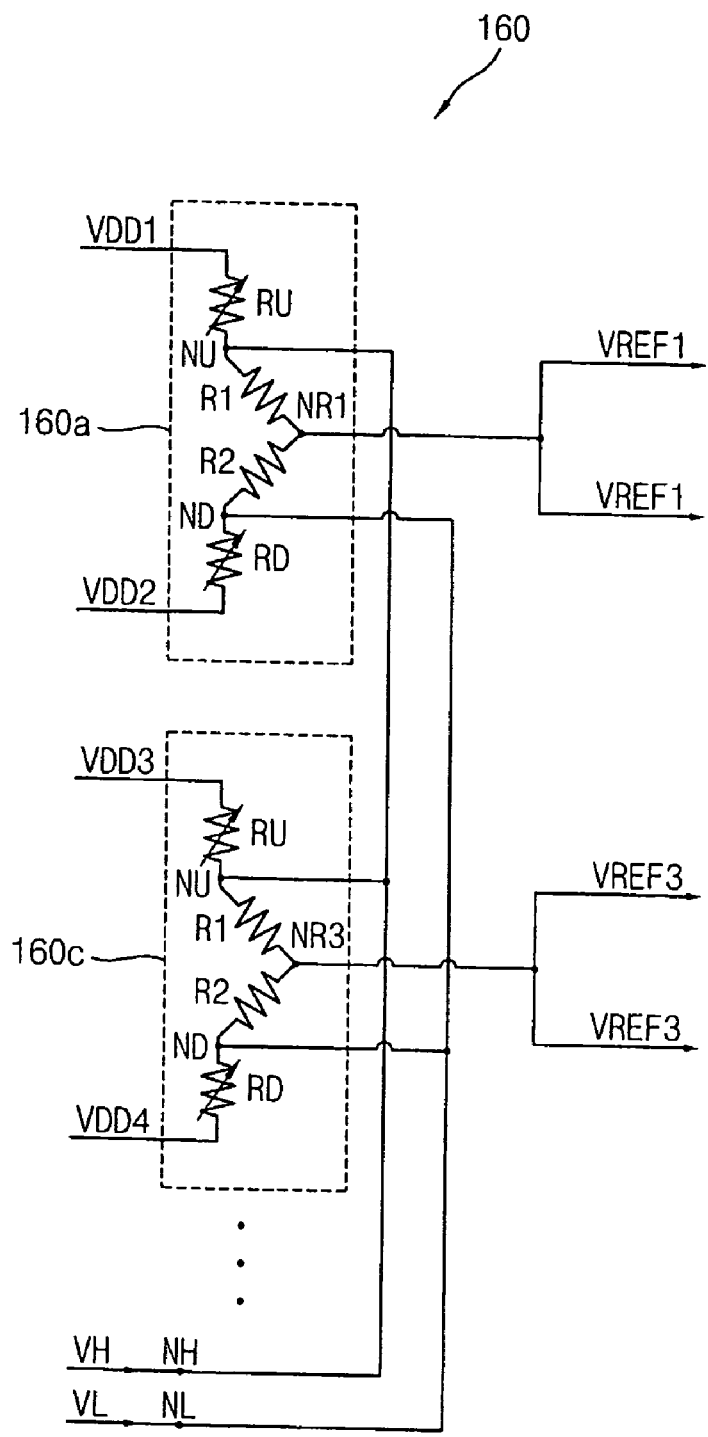
FIG. 11 illustrates an exemplary embodiment of a reference voltage generator employable by the receiver shown in FIG. 10.

FIG. 11 illustrates an exemplary embodiment of the reference voltage generator 160 employable by the receiver 240' shown in FIG. 10. In general, only differences between the exemplary reference voltage generator 160 shown in FIG. 11 and the exemplary reference voltage generator 140 shown in FIG. 9 will be described below. Each of the reference voltage generating units 160a, 160b may include a plurality of resistors, and more particularly, e.g., a pull-up variable resistor RU, a pull-down variable resistor RD, a first resistor R1 and a second resistor R2. Resistances of the pull-up variable resistor RU and the pull-down variable resistor RD may be set by a resistance control circuit (not shown), which may be included in the receiver 240'.

More particularly, as shown, e.g., in FIG. 11, one of the voltage generating units 160a, 160c may be associated with two of the termination voltages, e.g., VDD1, VDD2, VDD3, VDD4, and thus, in some embodiments of the invention, there may be half as many reference voltage generating units, e.g., 160a, 160c, as termination voltages, e.g., VDD1 to VDD4 and/or terminated data input signals, e.g., IS1 to IS4. For each voltage generating unit 160a, 160c, the pull-up resistor RU, the first resistor R1, the second resistor R2 and the pull-down resistor RD may be connected between one of the respective termination voltages, e.g., VDD1, and another of the respective termination voltages, e.g., VDD2. That is, e.g., the pull-up resistor RU, the first resistor R1, the second resistor R2 and the pull-down resistor RD of the first reference voltage generating unit 160a may be connected in series between the first termination voltage VDD1 and the second termination voltage VDD2, and the pull-up resistor RU, the first resistor R1, the second resistor R2 and the pull-down resistor Rd of the second reference voltage generating unit 160c may be connected in series between the third termination voltage VDD3 and the fourth termination voltage VDD3. For each of the voltage generating units 160a, 160c, e.g., a respective pull-up node NU may correspond to a node between the pull-up resistor RU and the first resistor R1, and the pull-up node NU may be connected to the second voltage node NH, and a respective pull-down node ND may correspond to a node between pull-down resistor RD and the second resistor R2, and the pull-down node ND may be connected to the first voltage node NL. A respective reference node NR1, NR3 may correspond to a node between the respective first and second resistors R1, R2.

Exemplary embodiments of the present invention have been disclosed herein, and although specific terms are employed, they are used and are to be interpreted in a generic and descriptive sense only and not for purpose of limitation. While embodiments of the present invention have been described relative to a hardware implementation, the processing of present invention may be implemented in software, e.g., by an article of manufacture having a machine-accessible or readable medium including data that, when accessed by a machine, e.g., a processor, cause the machine to perform a method, according to one or more aspects of the invention, for generating a plurality of reference voltages. Accordingly, it will be understood by those of ordinary skill in the art that various changes in form and details may be made without departing from the spirit and scope of the present invention as set forth in the following claims.

What is claimed is:

1. A reference voltage generator comprising:
multiple reference voltage generator units for generating multiple reference voltages that respectively correspond to a plurality of terminated input signals received from a transmitter, each reference voltage generator unit receiving at least one unique termination voltage and generating each reference voltage based on the respective unique termination voltage.

2. The reference voltage generator as claimed in claim 1, wherein each reference voltage and the corresponding terminated input signal are commonly based on the respective unique termination voltage so that each reference voltage and the corresponding terminated input signal are commonly adjusted according to variation of the respective unique termination voltage.

3. The reference voltage generator as claimed in claim 1, wherein the unique termination voltages are provided respectively from a plurality of termination nodes that are distributed along a power supply line of a receiver.

4. The reference voltage generator as claimed in claim 1, wherein the multiple reference voltage generator units receive a first voltage that is based on a transmitter voltage.

5. The reference voltage generator as claimed in claim 4, wherein each reference voltage generator unit includes a first resistor between a reference node and the unique termination voltage, and a second resistor between the first voltage and the reference node.

6. The reference voltage generator as claimed in claim 5, wherein the second resistor is common to all reference voltage generator units.

7. The reference voltage generator as claimed in claim 5, wherein the second resistor is separate for each reference voltage generator unit.

8. The reference voltage generator as claimed in claim 1, wherein the multiple reference voltage generator units receive a first voltage that is based on a driver ground voltage of the transmitter, and a second voltage based on a driver power supply voltage of the transmitter.

9. The reference voltage generator as claimed in claim 8, wherein each reference voltage generator unit generates the respective reference voltage based on an average of a low signal and a high signal, the low signal being an average of the first voltage and a first termination voltage, the high signal being an average of the second voltage and a second termination voltage.

10. The reference voltage generator as claimed in claim 9, wherein the first and second termination voltages are equal.

11. The reference voltage generator as claimed in claim 9, wherein the first and second termination voltages are from adjacent termination nodes that are distributed along a power supply line of a receiver.

12. A receiver, comprising:
  a power supply line including a plurality of termination nodes for providing a plurality of unique termination voltages, the termination nodes being distributed along the power supply line
  a plurality of termination circuits, each termination circuit receiving each unique termination voltage and outputting a corresponding terminated input signal; and
  the reference voltage generator as claimed in claim 1.

13. The receiver as claimed in claim 12, further comprising:
  a plurality of data input buffers, each data input buffer receiving each terminated input signal and the corresponding reference voltage that are commonly adjusted according to variation of the respective unique termination voltage.

14. The receiver as claimed in claim 12, wherein the multiple reference voltage generator units in the reference voltage generator receive a first voltage based on a transmitter voltage.

15. The receiver as claimed in claim 12, wherein the multiple reference voltage generator units in the reference voltage generator receive a first voltage that is based on a driver ground voltage of the transmitter, and a second voltage that is based on a driver power supply voltage of the transmitter.

16. A system, comprising:
  a plurality of transmission lines;
  a transmitter outputting respective signals to each of the plurality of transmission lines; and
  the receiver as claimed in claim 12, the receiver receiving each of the signals via respective transmission lines.

17. The system as claimed in claim 16, further comprising a first voltage transmission line,
  wherein the transmitter includes a first voltage driver outputting a first voltage to the first voltage transmission line, the first voltage being based on a transmitter voltage, and
  wherein the multiple reference voltage generator units in the receiver receive the first voltage via the first voltage transmission line.

18. The system as claimed in claim 17, wherein each reference voltage generator unit includes a first resistor between a reference node and the unique termination voltage, and a second resistor between the first voltage and the reference node.

19. The system as claimed in claim 16, further comprising a first voltage transmission line and a second voltage transmission line,
  wherein the transmitter includes a first voltage driver outputting a first voltage to the voltage transmission line, and a second voltage driver outputting a second voltage to the second voltage transmission line, the first voltage being based on a driver ground voltage of the transmitter, the second voltage signal being based on a driver power supply voltage of the transmitter, and
  wherein the multiple reference voltage generator units in the receiver receive the first voltage via the first voltage transmission line and the second voltage via the second voltage transmission line.

20. The system as claimed in claim 19, wherein each reference voltage generator unit generates the respective reference voltage based on an average of a low signal and a high signal, the low signal being an average of the first voltage signal and a first termination voltage, the high signal being an average of the second voltage signal and a second termination voltage.

* * * * *